United States Patent
Li et al.

(10) Patent No.: US 9,488,855 B2
(45) Date of Patent: Nov. 8, 2016

(54) ARRAY SUBSTRATE, METHOD FOR FABRICATING THE SAME AND DISPLAY DEVICE

(71) Applicant: BEIJING BOE OPTOELECTRONICS TECHNOLOGY CO., LTD., Beijing (CN)

(72) Inventors: Xin Li, Beijing (CN); Lei Tang, Beijing (CN); Ying Zhang, Beijing (CN); Yang Pei, Beijing (CN); Zhenwei Wang, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 13/963,336

(22) Filed: Aug. 9, 2013

(65) Prior Publication Data

US 2014/0042465 A1     Feb. 13, 2014

(30) Foreign Application Priority Data

Aug. 10, 2012    (CN) .......................... 2012 1 0285258

(51) Int. Cl.
    *H01L 31/00*        (2006.01)
    *G02F 1/13*         (2006.01)
               (Continued)

(52) U.S. Cl.
    CPC ....... *G02F 1/1309* (2013.01); *G02F 1/134363* (2013.01); *G02F 1/136227* (2013.01); *H01L 27/124* (2013.01)

(58) Field of Classification Search
CPC .. G02F 1/13; G02F 1/1309; G02F 1/134363; H01L 29/786; H01L 23/544
USPC ....... 257/88, 59, 72, 48; 438/34; 349/54, 55, 349/144, 39, 40, 42–48, 192, 141
See application file for complete search history.

(56) References Cited

U.S. PATENT DOCUMENTS

2010/0245700 A1*   9/2010   Zhao et al. ...................... 349/48
2010/0259714 A1*   10/2010   Liu ................... G02F 1/134363
                                                             349/141

(Continued)

FOREIGN PATENT DOCUMENTS

CN        101256326 A      9/2008
CN        102236179 A      11/2011

(Continued)

OTHER PUBLICATIONS

Google Translation of CN101770122.*

(Continued)

*Primary Examiner* — Matthew Landau
*Assistant Examiner* — Eric Ashbahian
(74) *Attorney, Agent, or Firm* — Ladas & Parry LLP

(57) ABSTRACT

Provided are an array substrate, a method for fabricating the same and a display device. The array substrate comprises: a transparent pixel electrode, a first data line and a first transparent common electrode, the array substrate further comprises: a second data line and an insulating layer having a via hole disposed in an non-aperture region of the array substrate, the second data line is connected to an extension of the transparent pixel electrode and connected to the second transparent common electrode through the via hole in the insulting layer.

9 Claims, 4 Drawing Sheets

(51) Int. Cl.
*G02F 1/1343* (2006.01)
*G02F 1/1362* (2006.01)
*H01L 27/12* (2006.01)

(56) References Cited

U.S. PATENT DOCUMENTS

2011/0273640 A1 11/2011 Zhang
2012/0140137 A1* 6/2012 Ono et al. .................. 349/43
2012/0273789 A1* 11/2012 Hui .................. G02F 1/136227
257/59

FOREIGN PATENT DOCUMENTS

| CN | 102629046 | A | 8/2012 | |
| CN | 102629060 | A | 8/2012 | |
| CN | 101770122 | * | 9/2012 | ............... G02F 1/13 |

OTHER PUBLICATIONS

First Chinese Office Action Appln. No. 201210285258.1; Dated Oct. 8, 2015.
Second Chinese Office Action Appln. No. 201210285258.1; Dated May 5, 2016.

* cited by examiner

ARRAY SUBSTRATE, METHOD FOR FABRICATING THE SAME AND DISPLAY DEVICE

FIELD OF THE ART

Embodiments of the invention relate to the technical field of array substrates for liquid crystal displays (LCDs), more particularly, to an array substrate, a method for fabricating the same and a display device.

BACKGROUND

Among conventional fabrication processes for thin film transistor liquid crystal displays (TFT-LCDs), Advanced Super Dimension Switch (AD-SDS, also abbreviated as ADS) generates a multi-dimensional electric field with both an electric field produced at edges of slit electrodes in the same plane and an electric field produced between a slit electrode layer and a plate-like electrode layer, consequently, liquid crystal molecules at all orientations, which are located directly above the electrodes and between the slit electrodes in a liquid crystal cell, can be rotated, thereby enhancing the work efficiency of liquid crystals and increasing the light transmittance. Therefore, the ADS technology can improve the picture quality of TFT-LCDs and has advantages of high transmittance, wide viewing angle, high aperture ratio, low chromatic aberration, low response time and being free of push Mura, etc.

FIG. 1 illustrates a schematic configuration of an array substrate in conventional ADS-mode LCDs, in which films are formed in the following order: a gate line P1, a semiconductor layer P2, a transparent pixel electrode P3, a first data line P4 and a first transparent common electrode P6, where the first transparent common electrode P6 is disposed over the transparent pixel electrode P3 and an electric field is formed between the first transparent common electrode P6 and the transparent pixel electrode P3. The first transparent common electrode P6 is a slit electrode and the transparent pixel electrode P3 is a flat or plate-shape electrode or a slit electrode. Herein, the term "over" is used to indicate position relationship and does not necessarily represent contact with each other. FIG. 2 illustrates a cross section taken along the line A-B of FIG. 1. As shown in FIG. 2, neither the transparent pixel electrode P3 and a part of the first data line P4 connected thereto is exposed, on the contrary, they are covered by an insulating layer P7. As a result, the switch property of the TFT can not be tested.

A signal voltage of the transparent pixel electrode can not be obtained due to that the transparent pixel electrode is not exposed on the top layer, which makes it impossible to test the switch characteristic of the TFT in the pixel element and causes severe difficulty in test and analysis.

SUMMARY

An aim of the invention is to provide an array substrate, a method for fabricating the same and a display device, such that the TFT switch characteristic may be tested.

To meet the above requirement, the invention provides the following technical solutions:

An aspect of the invention provides an array substrate, comprising: a gate line, a transparent pixel electrode, a first data line and a first transparent common electrode, wherein the first transparent common electrode is disposed over the transparent pixel electrode and used to generate an electric field between the first transparent common electrode and the transparent pixel electrode; the array substrate further comprises: a second data line, a second transparent common electrode and an insulating layer disposed between the second data line and the second transparent common electrode and having a via hole, wherein the second data line and the insulting layer are disposed in an non-aperture region of the array substrate;

wherein the transparent pixel electrode has an extension, the second data line is connected to the extension and connected to the second transparent common electrode through the via hole in the insulting layer.

wherein the extension is disposed in the non-aperture region.

wherein the second transparent common electrode is disposed in the non-aperture region.

wherein the second data line is plural and in shape of square, circle, rectangle or diamond.

wherein shapes of the via hole and the second data line are the same.

wherein shapes of the second transparent common electrode and the second data line are the same.

wherein the non-aperture region is a light-blocking region of the array substrate.

Another aspect of the invention provides a method for fabricating an array substrate, the method comprises:

forming a pattern of a gate line and a pattern of a transparent pixel electrode sequentially on a substrate through patterning processes;

forming a pattern of first and second data lines through a patterning process, wherein the second data line is connected to the transparent pixel electrode;

forming a pattern of an insulting layer with a via hole through a patterning process;

forming a pattern of a first transparent common electrode and a pattern of a second transparent common electrode through patterning processes, wherein the second transparent common electrode is connected to the second data line through the via hole in the insulating layer.

wherein forming a pattern of a gate line and a pattern of a transparent pixel electrode sequentially on a substrate through patterning processes comprises:

forming a gate metal layer through deposition and forming the pattern of the gate line through the patterning process; forming a transparent pixel metal layer through deposition, and forming the pattern of the transparent pixel electrode through the patterning process.

wherein forming a pattern of first and second data lines through a patterning process comprises:

forming a first data line metal layer and a second data line metal layer through deposition and forming the pattern of the first data line and the second data line through the patterning process.

wherein forming a pattern of an insulting layer with a via hole through a patterning process comprises:

forming an insulating layer through deposition and forming the pattern of the insulating layer having the via hole through the patterning process, wherein the shape of the via hole is the same as the shape of the second data line.

wherein forming a pattern of a first transparent common electrode and a pattern of a second transparent common electrode through patterning processes comprises:

forming a first transparent common metal layer and a second transparent common metal layer through deposition and forming the pattern of the first transparent common electrode and the pattern of the second transparent common electrode through the patterning process.

A further aspect of the invention provides a display device comprising the above array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE REFERENCE NUMERALS

P1, 1: gate line; P2, 2: semiconductor layer; P3, 3: transparent pixel electrode; 31: extension; P4, 4: first data line; 5: via hole; P6, 6: first transparent common electrode; P7, 7: insulating layer; 8: second data line; 9: second transparent common electrode.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The general concept of the invention is to dispose a second data line connected to the transparent pixel electrode and a second transparent common electrode in the non-aperture region of the array substrate, wherein the second data line is also connected to the second transparent common electrode through a via hole in the insulting layer.

In the following, the invention will be described in detail in connection with the figures.

Figure 1:
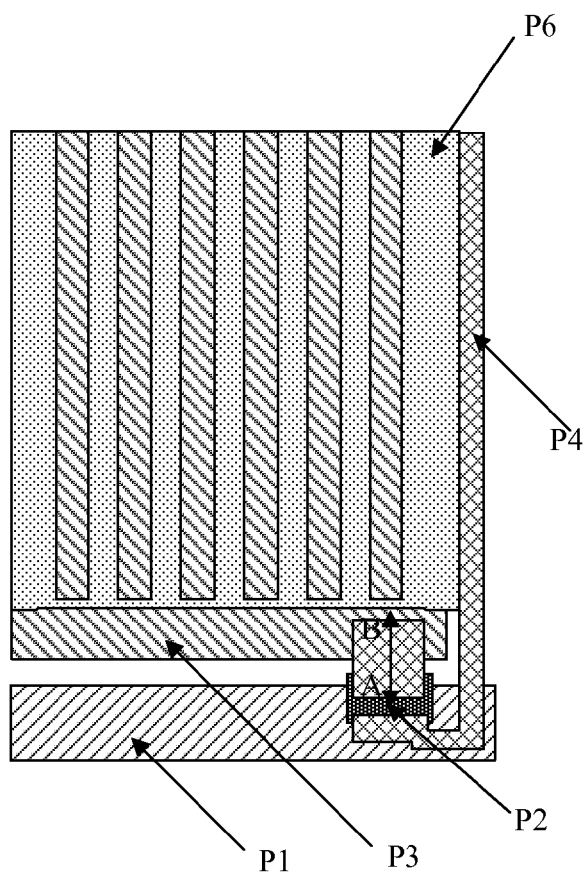
FIG. 1 schematically illustrates a configuration of an array substrate in a conventional ADS-mode LCD.
Figure 2:
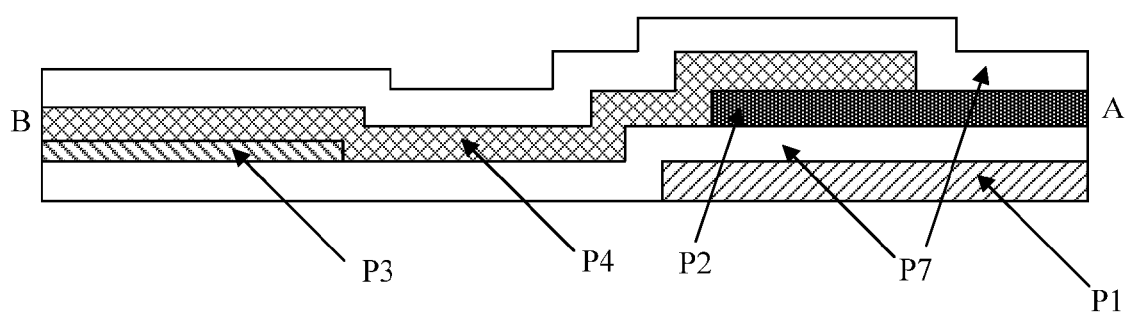
FIG. 2 is a cross section taken along line A-B of FIG. 1.
Figure 3:
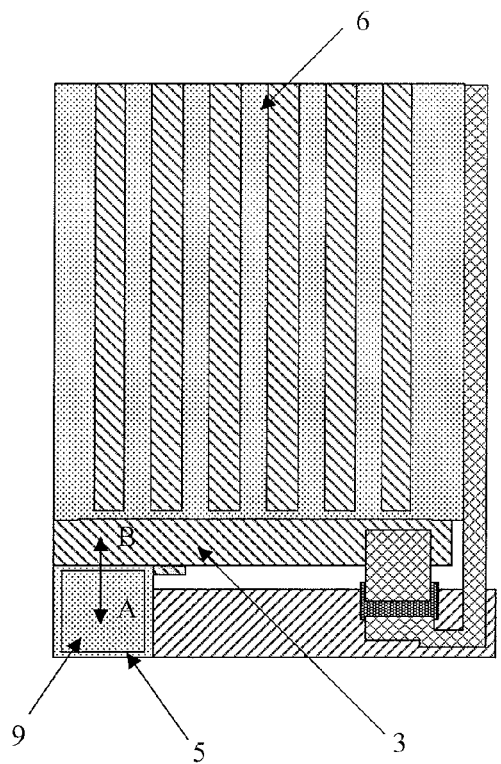
FIG. 3 schematically illustrates a configuration of an array substrate in an ADS-mode LCD in accordance with an embodiment of the invention.
Figure 4:
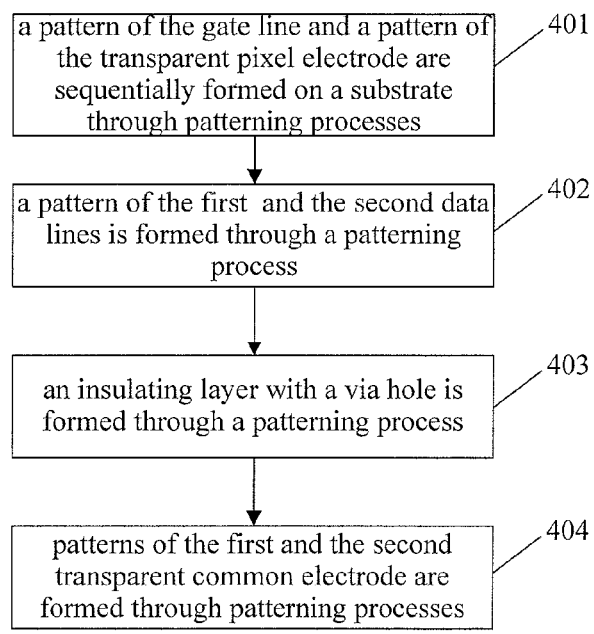
FIG. 4 schematically illustrates a flow chart of a method for fabricating the array substrate in accordance with an embodiment of the invention.

FIG. 3 schematically illustrates a configuration of an array substrate in an ADS-mode LCD in accordance with an embodiment of the invention, in which a second data line connected to the transparent pixel electrode 3 and a second transparent common electrode 9 are disposed in the non-aperture region of the original array substrate, where the second data line is also connected to the second transparent common electrode 9 through a via hole 5 disposed in the insulating layer and partly covered by the second transparent common electrode 9 (See FIG. 7) and thus not shown in FIG. 3. A method for fabricating the array substrate as illustrated in FIG. 4 will be described, which comprises:

Step 401: a pattern of the gate line and a pattern of the transparent pixel electrode are sequentially formed on a substrate through patterning processes.

Figure 5:
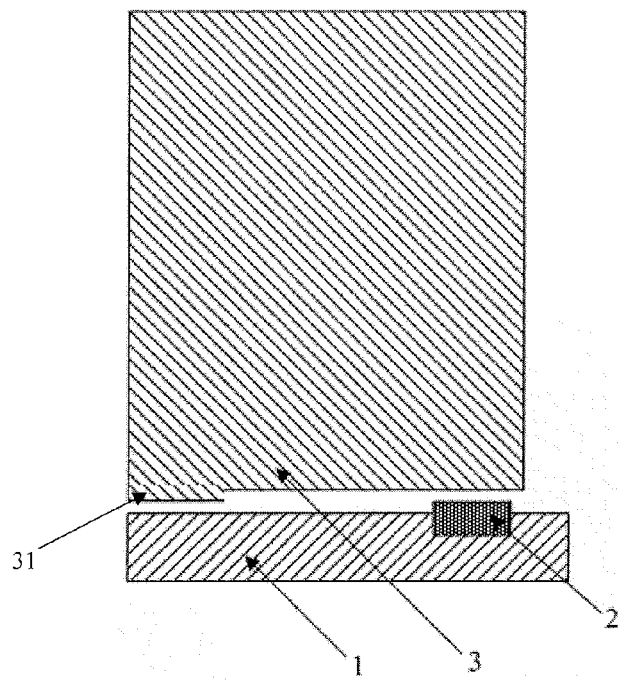
FIG. 5 schematically illustrates a configuration after a transparent pixel electrode is formed in accordance with an embodiment of the invention.

For example, as illustrated in FIG. 5, a gate metal layer is first formed on the substrate using deposition and then a pattern of the gate line 1 is formed using lithography and etching. Next, a semiconductor layer is formed using deposition and then a pattern of the semiconductor layer 2 is formed using lithography and etching. After that, a transparent pixel metal layer is formed using deposition and a pattern of the transparent pixel electrode 3 is formed using lithography and etching. Here, a gate insulating layer (not shown in FIG. 5) may be disposed on the gate metal layer.

In the step, the pattern of the gate line and the pattern of the semiconductor layer may be formed using conventional method in the technical field, which will not be described in detail here. As illustrated in FIG. 5, in comparison with conventional arts, the transparent pixel electrode 3 has an extension 31 extending downwards which does not cover the gate line 1. The extension 31 is used for the connection to the second data line. The extension is disposed in a non-aperture region and has a size determined as necessary.

Step 402: a pattern of the first and second data lines is formed through a patterning process.

Figure 6:
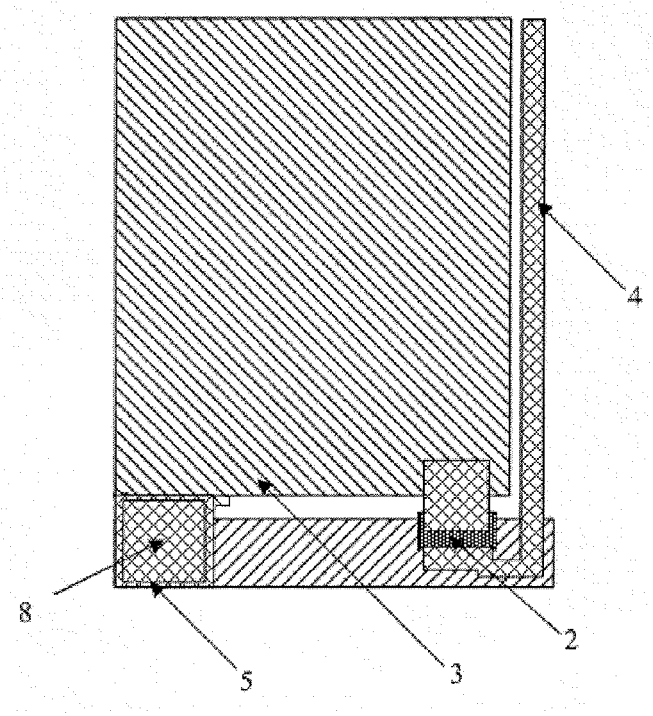
FIG. 6 schematically illustrates a configuration after a data line and a via hole are formed in accordance with an embodiment of the invention.

For example, as shown in FIG. 6, a data line metal layer is first formed using deposition and a pattern of the data line is formed using lithography and etching. Other than the pattern of the first data line 4, the pattern of the data line further comprises a pattern of the second data line 8 connected to the transparent pixel electrode 3 and disposed in the non-aperture region of the array substrate.

In present invention, the non-aperture region is a light-blocking region in the array substrate, such as a region where the gate line or the data line locates, or a region where a black matrix locates when the array substrate comprises the black matrix, or a region of the array substrate corresponding to a black matrix on a color filter substrate when the array substrate is used to be assembled with a color filter substrate having the black matrix.

Note that, the non-aperture region as recited in present invention is not strictly confined to the situation of not occupying the aperture region at all. To ensure the effectiveness and convenience of the test, the region of the second data line and/or insulating layer may slightly extend outside the non-aperture region, as long as the influence on the aperture ratio is in an acceptable extent (which may be decided as necessary). On the other hand, the region of the second data line and/or the insulating layer may extend outside the non-aperture region and into a part of the aperture region due to the tolerance deviation during the fabrication process; in this case, the influence on the aperture ratio is also negligible. All the above situations are covered by the scope of the invention.

In present invention, the second data line may be plural in number and not limited to a specific shape. The second data line is not necessarily a line, it can also have a square, circular, a rectangular, a diamond or other irregular shapes. The shapes of the second data lines may be same or different from each other. When fabricated, the second data line may be formed with the same material as the first data line and at the same time.

The second data line 8 can also be disposed at a position close to the semiconductor layer 2, that is, at any position between the current position and the semiconductor layer 2 shown in FIG. 6.

Step 403: an insulating layer with a via hole is formed through a patterning process.

For example, an insulating layer is formed using deposition and a pattern of an insulating layer having a via hole 5 is formed using lithography and etching. The shape of the via hole 5 may be the same as or different from the shape of the second data line 8, as along as the second data line 8 may be exposed from the via hole. The insulating layer is not shown in FIG. 6.

Step 404: patterns of the first and the second transparent common electrode are formed through patterning processes.

For example, a first and a second transparent common electrode metal layers are formed using deposition and patterns of the first and the second transparent common electrodes 6 and 9 are formed using lithography and etching. The second transparent common electrode 9 is connected to the second data line 8 formed in step 402 through the via hole 5 formed in step 403 and the array substrate having the configuration of FIG. 3 is eventually formed by this step. The pattern of the second transparent common electrode 9 may be the same as or different to the pattern of the second data line.

Here, on the premise of not blocking the light-transmitting region, the pattern of the second transparent common electrode occupies an area as large as possible so as to have better contact with a probe during consequent test.

Figure 7:
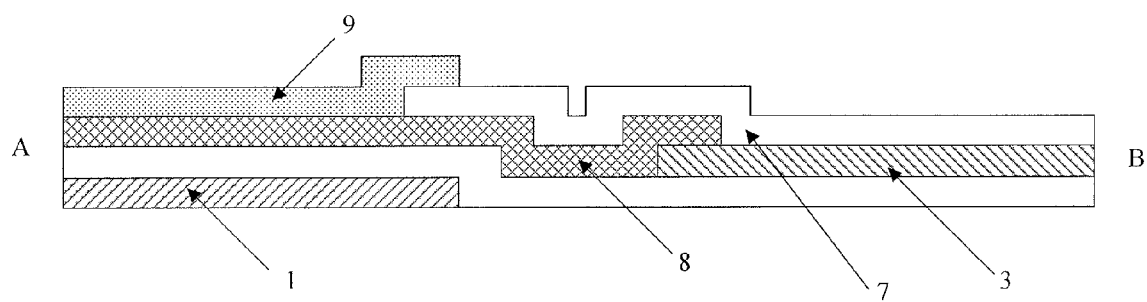
FIG. 7 is a cross section taken along the line A-B of FIG. 3.

FIG. 7 is a cross-section taken along the line A-B of FIG. 3. With reference to both FIG. 3 and FIG. 7, it is seen that the second data line 8 is connected to the transparent pixel electrode 3 and the second transparent common electrode 9 is connected to the second data line 8 through the via hole 5 disposed on the insulating layer 7.

In the embodiment of the invention, the electrode signal from the transparent pixel electrode 3 connected to the second data line 8 may be tested by testing the second transparent common electrode 9 exposed at the via hole 5, thereby testing the switch characteristic of the TFT. Furthermore, the aperture ratio is not affected as the second data line and the second transparent common electrode are disposed in the non-aperture region.

Of course, the embodiments of the invention also apply to other LCD types other than the ADS-mode LCD.

The patterning process as used in the invention comprise any process that can be used to form the necessary patterns, such as a patterning process using mask, which includes exposing, developing and etching, or a pattern process using print technology, and the like.

What are described above is related to the illustrative embodiments of the disclosure only and not limitative to the scope of the disclosure; the scopes of the disclosure are defined by the accompanying claims.

What is claimed is:

1. An array substrate, comprising: a gate line, a transparent pixel electrode, a first data line and a first transparent common electrode, wherein the first transparent common electrode is disposed over the transparent pixel electrode and used to generate an electric field between the first transparent common electrode and the transparent pixel electrode; the array substrate further comprises: a second data line, a second transparent common electrode and an insulating layer disposed between the second data line and the second transparent common electrode and having a via hole, wherein the second data line and the insulating layer are disposed in a non-aperture region of the array substrate;

wherein the transparent pixel electrode has an extension, the second data line is physically connected to the extension and physically and electrically connected to the second transparent common electrode through the via hole in the insulating layer, and the second data line overlays a portion of the extension, wherein the extension of the transparent pixel electrode is a protrusion toward the gate line, and the extension and the gate line are disposed with an interval therebetween, and wherein the first data line and the second data line are disposed in a same layer, the second data line is overlapped with the gate line, the extension of the transparent pixel electrode, and the interval between the gate line and the extension of the transparent pixel electrode.

2. The array substrate of claim 1, wherein the extension is disposed in the non-aperture region.

3. The array substrate of claim 1, wherein the second transparent common electrode is disposed in the non-aperture region.

4. The array substrate of claim 1, wherein the second data line is plural and in shape of square, circle, rectangle or diamond.

5. The array substrate of claim 3, wherein shapes of the via hole and the second data line are the same.

6. The array substrate of claim 3, wherein shapes of the second transparent common electrode and the second data line are the same.

7. The array substrate of claim 1, wherein the non-aperture region is a light-blocking region of the array substrate.

8. A display device comprising the array substrate of claim 1.

9. The array substrate of claim 1, wherein the first and second transparent common electrodes are disposed in a same layer.

* * * * *